United States Patent [19]

Boyle et al.

[11] Patent Number: 5,003,191

[45] Date of Patent: Mar. 26, 1991

[54] EMISSION OF PULSED ENERGY

[75] Inventors: Peter Boyle, E. Twickenham; Robert A. Dyke, Hanworth; Raymond Carlton, London, all of England

[73] Assignee: EMI Limited, Hayes, England

[21] Appl. No.: 97,742

[22] Filed: Nov. 26, 1979

[30] Foreign Application Priority Data

Nov. 25, 1978 [GB] United Kingdom ............... 46085

[51] Int. Cl.$^5$ ................... H03K 3/281; H03K 3/53
[52] U.S. Cl. ................... 307/109; 307/246; 307/261; 307/283; 307/302; 307/254; 307/272.1; 307/296.3; 320/1
[58] Field of Search ............ 356/4; 307/254, 272 R, 307/294, 109, 283, 261, 260, 302, 561, 246, 607, 296 A; 361/58, 98; 320/1; 328/55

[56] References Cited

U.S. PATENT DOCUMENTS 3,075,092  1/1963  Dill ........................... 307/283 X
3,546,490  12/1970  Sangster ....................... 307/607
3,665,222  5/1972  Gatwood ....................... 307/283

Primary Examiner—Thomas H. Tarcza
Assistant Examiner—John B. Sotomayor
Attorney, Agent, or Firm—Fleit, Jacobson, Cohn, Price, Holman & Stern

[57] ABSTRACT

A circuit (FIG. 1) for generating a current impulse comprises an avalanche transistor 2 which responds to a stimulus to apply an electrical impulse to the bases of a plurality of further avalanche transistors 3, 6. The further transistors respond to the impulse to discharge respective equal capacitors 9–12 through a laser diode 7. Further equal capacitors 22–25 connect the emitters of the transistors to the common junction of the transistor 2 and an impedance 21 to generate the electrical impulse when the transistor 2 responds to the stimulus. The arrangement of the further capacitors ensures that once one further transistor begins to conduct, the electrical stress on the others is increased, thus ensuring the further transistors simultaneously avalanche.

4 Claims, 3 Drawing Sheets

EMISSION OF PULSED ENERGY

BACKGROUND OF THE INVENTION

The present invention relates to the emission of pulsed energy and it relates especially, though not exclusively, to an electrical drive circuit for causing a laser device to emit well defined pulses of infra-red energy.

A requirement for such a drive circuit exists, for example, in the field of high resolution range finding, where semi-conductor devices are used to trigger the laser device. It is necessary to apply such a high current to the laser device that the current has to be shared amongst a plurality of the semi-conductor devices but, if this is done, a problem occurs because the triggering pulse, which should be of well defined shape and of a short duration, such as around ten nanoseconds or more, tends to be degraded because different devices have different characteristics.

It has been proposed to attack this problem by individual adjustment of the operating voltages applied to the various devices. This, however, is undesirable in practice and it is an object of this invention to provide a different, and more satisfactory, technique for overcoming or reducing the aforementioned problem.

SUMMARY OF THE INVENTION

According to the invention, there is provided an electrical drive circuit for applying a current impulse to an output of the circuit, the circuit including a first semiconductor avalanche transistor arranged to receive a pulsed stimulus in response to which it produces an electrical impulse, a plurality of further semiconductor avalanche transistors, the bases of said further semiconductor avalanche transistors being connected in parallel to receive said electrical impulse, and the collector-emitter path of each of the said further semiconductor avalanche transistors being connected in series with a respective capacitor, the circuit also comprising further capacitors of equal value each being connected to the collector-emitter path of a respective further semiconductor avalanche transistor and being commonly connected to the said first semiconductor avalanche transistor to apply their charges to the respective bases of the said further semiconductor avalanche transistors when the first semiconductor avalanche device receives the said stimulus, whereby the further semiconductor avalanche transistors receive the electrical impulse in parallel to jointly apply the charge on the first capacitors to the output.

The invention thus resides in causing one avalanche device to stimulate, in parallel the operation of a plurality of further such devices.

The avalanche devices used in practice are transistors, and it has been found by testing a number of such devices that the best results are currently achieved with devices manufactured by National Semiconductor and identified by the manufacturer's number 2N 3019 and 2N 3725. These are non-overlay, double diffused silicon epitaxial devices and in general, that class of devices has been found to be the most suitable for the present purposes. It should be noted, however, that the invention applies to any type of avalanche transistor device.

Within the principles of the invention, a number of arrangements are possible. Circuits have been constructed, for example, with one drive transistor feeding three output transistors which, in turn trigger the laser. Another circuit contained six output transistors, arranged in two groups of three, each group having a respective drive transistor; the two drive transistors being driven by a common pre-driver transistor, all the transistors being used in the avalanche mode.

BRIEF DESCRIPTION OF THE DRAWINGS

One embodiment of the invention will now be described with reference to the accompanying drawings, of which.

DESCRIPTION OF THE PREFERRED EMBODIMENT

Figure 1:
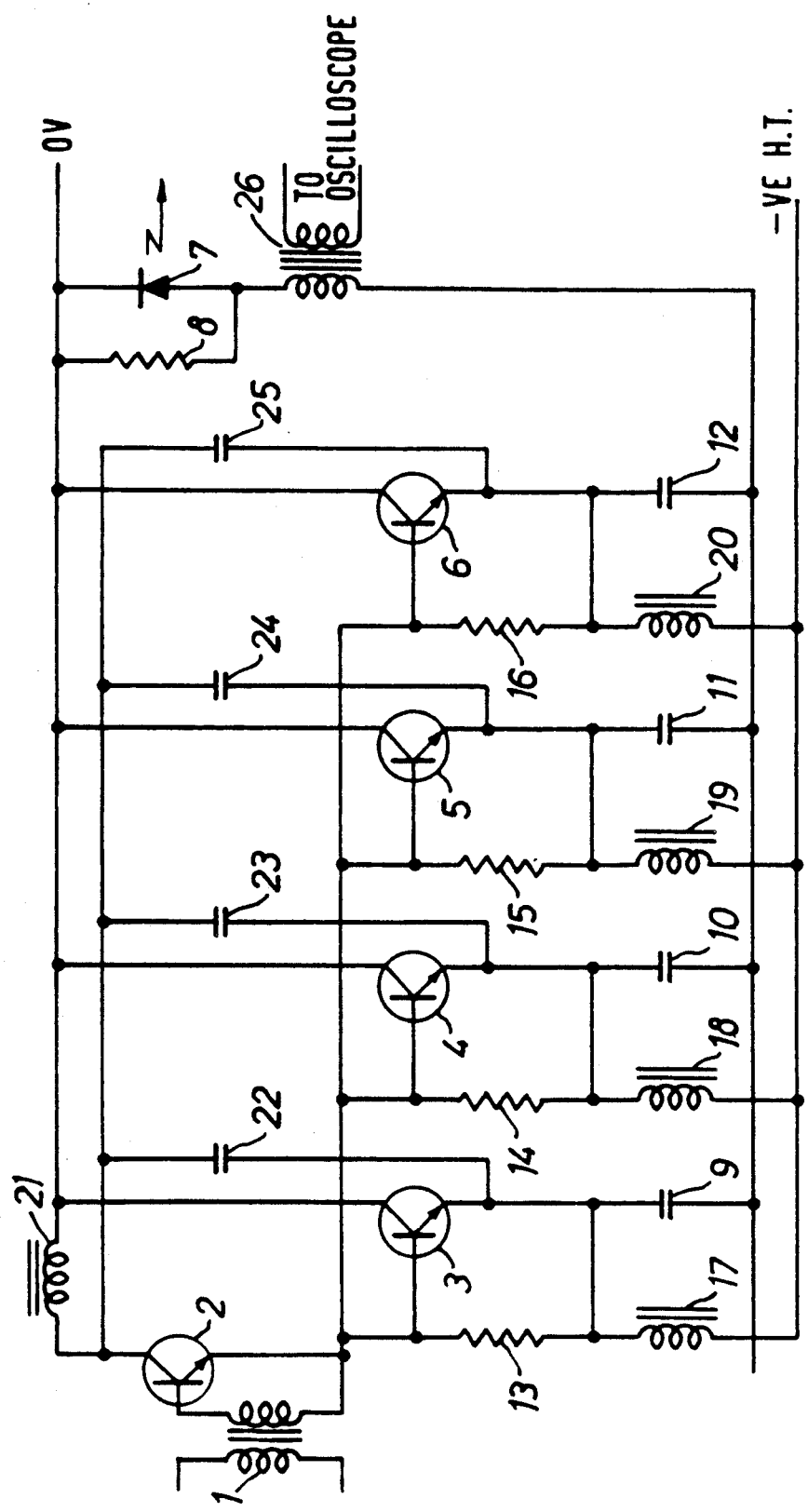
FIG. 1 is a block diagrammatic representation of a circuit in accordance with one example of the invention.

Referring now to the drawings, a fast rise time pulse is derived in a convenient manner and applied via a coupling transformer 1 to trigger an avalanche drive transistor 2. This discharge capacitor 22-25 through the base emitter junctions of respective avalanche transistors 3-6. The capacitors are of equal value (100 pF in this example) to ensure equal charge into each transistor base, and the circuit configuration is such that when one device starts to conduct it increases the stress on the other devices. This ensures that all the devices are triggered into the avalanche mode with the minimum difference in delay time between them-typically less than 1 ns. Resistors 13 to 16 (in this case 27Ω) are chosen to provide the optimum avalanche conditions for the transistors.

Figure 2:
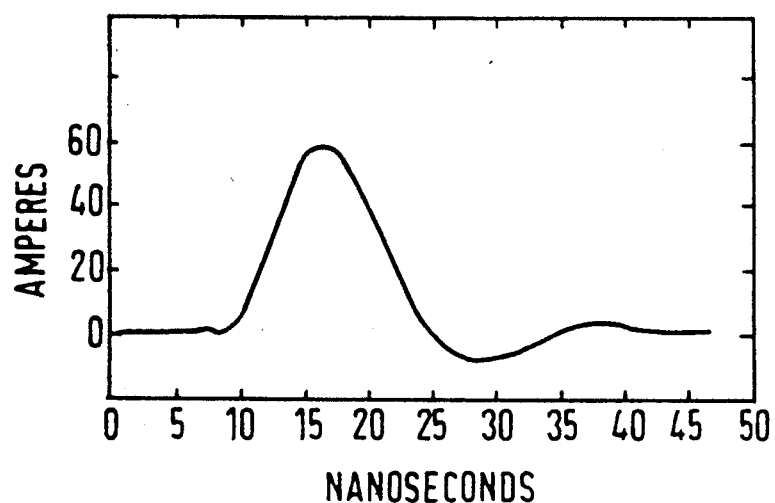
FIG. 2 shows a typical current/time waveform for a trigger pulse developed by the circuit shown in FIG. 1.

When transistors 3-6 are triggered into avalanche then they discharge capacitors 9-12 into the load 7 which, in this example, is an RCA type 40862. The capacitors 9-12 are of equal value (390pF in this example) to ensure load sharing of the transistors 3-6. The pulse shape is determined by a pulse forming network (PFN), which in this example is a single section LCR network where the loop inductance is determined by the circuit layout and the inductances of the components and where the loop resistance includes the resistances of the load, the capacitors and, in particular, the resistances of the avalanche transistors. An important principle aspect of this invention is that the effective resistance of the avalanche transistors in this application is a function of the pulse current through them. This resistance falls to a low value when the devices are triggered on, but rises again as the current pulse reduces. Thus the LCR circuit is under-damped on the trailing edge of the pulse, as can be seen in FIG. 2. The output pulse so produced has little overshoot and the reverse energy applied to the load is small and in the case of the circuit so described does not require any special protection for the laser diode (such as a reverse polarity high speed diode connected in parallel with the load).

Inductors 17 to 21 (each 100 μH in this example) represent high impedances to the pulse but low impedances to the charging current for capacitors 9-12 and 22-25. Resistor 8 is chosen to prevent the laser from reverse breakdown during the charging period and also to provide damping for the charging current circuit.

A transformer 26 is shown in the drawing. This would not be included in a circuit actually used for range finding, but it can be used to couple the output trigger pulse to be monitored under experimental conditions. FIG. 2 shows a typical trace exhibited on an oscilloscope under operation of the circuit of FIG. 1. It can be seen that the pulse amplitude is about 60 amperes and the pulse duration is just less than 15 nanoseconds.

Figure 3:
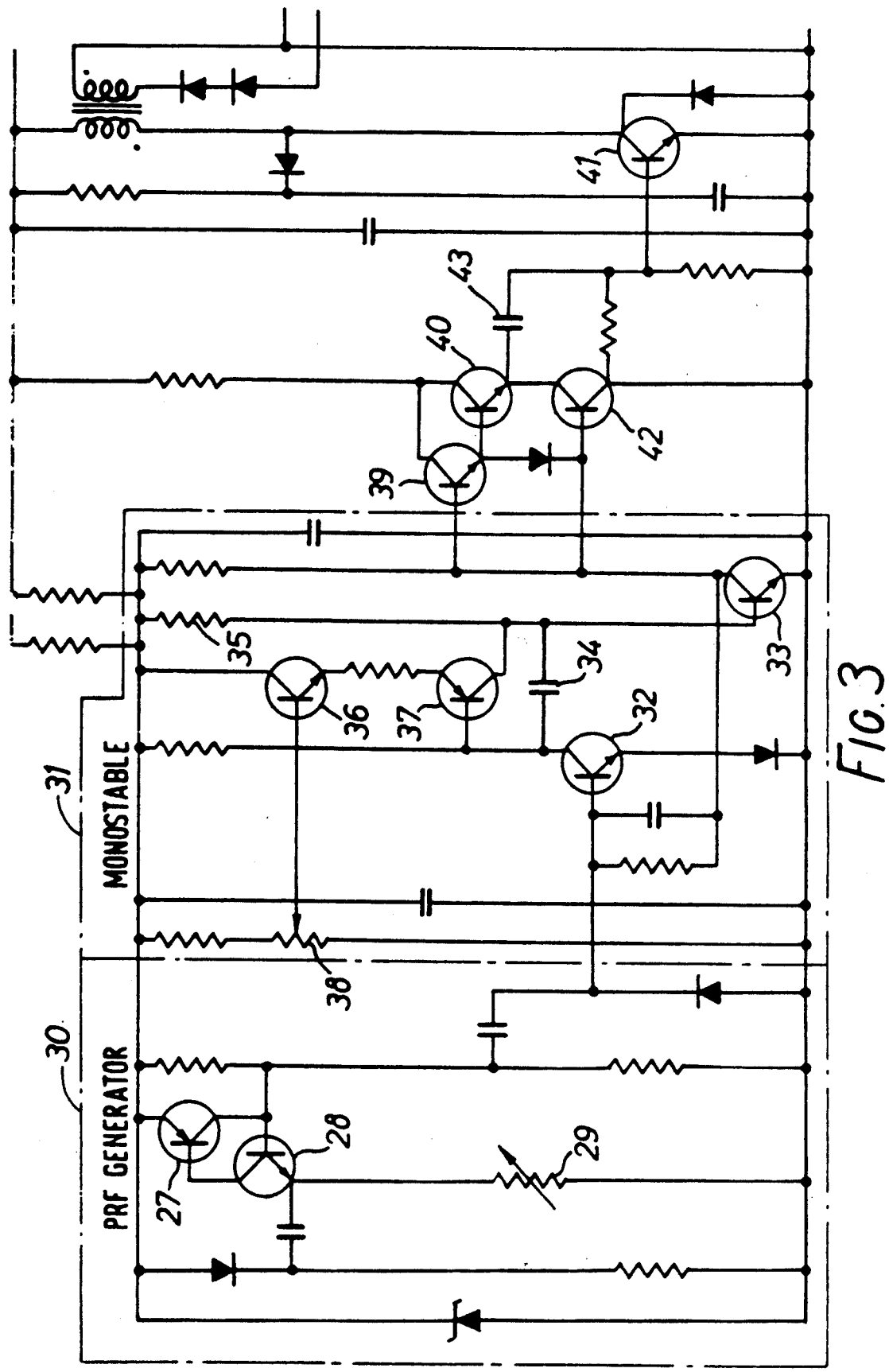
FIG. 3 shows a convenient form of drive circuit which can be used to supply energy to the circuit shown in FIG. 1.

The energy to operate the output circuit in relation to FIG. 1 is applied via the negative HT circuit and can conveniently be obtained from a ringing choke drive circuit of the kind shown in FIG. 3.

Transistors 27 and 28 determine the pulse repetition frequency (PRF) of the system. The PRF can vary from 1 kHz to 100 kHz by means of a variable resistor 29. The PRF generator, shown within the dashed outline 30, triggers a monostable circuit, shown within the dashed outline 31, of which transistors 32 and 33 are the basic transistors and capacitor 34 is the timing capacitor. Resistor 35 is the basic timing resistor, and this determines the maximum pulse width, and hence the maximum energy, that can be transferred to the output circuit. The pulse width is controlled by providing additional current into capacitor 34 through transistors 36 and 37 as determined by the resistance of a variable resistor 38.

Transistors 39 and 40 provide current gain to drive the ringing choke transistor 41, and transistor 42 with capacitor 43 is used to ensure the rapid turn-off of transistor 41 at the end of the drive period, hence minimizing switching losses. Transistor 41 is typically driven on for 7 μs to a peak current of 800 mA. The transformer 44 has a turns ratio of 1:5, and the secondary winding builds up to its peak ringing voltage of around 250 V in just under 3 μs.

It is stressed, as has been mentioned earlier, that the energy can be applied in any convenient way to the output circuit. The foregoing description of the FIG. 3 circuit is included for the sake of completeness only.

It is to be appreciated that, in order to achieve the above quoted performance from the circuit, the physical layout and the actual manner of construction of the circuit is very important, as is the choice of components used. However, it is considered that the appropriate knowledge is part of the skills of those skilled in circuit design, and so it is unnecessary to set it out here.

What we claim is:

1. An electrical drive circuit for applying a current impulse to an output of the circuit, the circuit including a first semiconductor avalanche transistor arranged to receive a pulsed stimulus in response to which it produces an electrical impulse, a plurality of further semiconductor avalanche transistors, the bases of said further semiconductor avalanche transistors being connected in parallel to receive said electrical impulse, and the collector-emitter path of each of the said further semiconductor avalanche transistors being connected in series with a respective capacitor the circuit also comprising further capacitors of equal value each being connected to a the collector-emitter path of a respective further semiconductor avalanche transistor and being commonly connected to the said first semiconductor avalanche transistor to apply their charges to the respective bases of the said further semiconductor avalanche transistors when the first semiconductor avalanche device receives the said stimulus, whereby the further semiconductor avalanche transistors receive the electrical impulse in parallel to jointly apply the charge on the first capacitors to the output.

2. A circuit according to claim 1 further comprising an impedance connecting the common junction of the further capacitors and the said first semiconductor avalanche device to one side of the output.

3. A circuit according to claim 2 wherein the impedance is an inductance.

4. A circuit according to claims 1 to 3 further comprising a laser diode connected across the said output.

* * * * *